(12) United States Patent
Zihir et al.

(10) Patent No.: US 10,418,719 B2
(45) Date of Patent: Sep. 17, 2019

(54) DISTRIBUTED TRANSCEIVER SIGNAL SWITCHING CIRCUIT

(71) Applicant: Integrated Device Technology, Inc., San Jose, CA (US)

(72) Inventors: Samet Zihir, San Diego, CA (US); Tumay Kanar, San Diego, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/130,114

(22) Filed: Sep. 13, 2018

(65) Prior Publication Data
US 2019/0089401 A1    Mar. 21, 2019

Related U.S. Application Data

(60) Provisional application No. 62/559,875, filed on Sep. 18, 2017, provisional application No. 62/560,173, filed on Sep. 18, 2017.

(51) Int. Cl.
*H01Q 21/00* (2006.01)
*H04B 1/44* (2006.01)
(Continued)

(52) U.S. Cl.
CPC ....... *H01Q 21/0006* (2013.01); *H01Q 1/2283* (2013.01); *H01Q 1/48* (2013.01); *H01Q 1/523* (2013.01); *H01Q 1/526* (2013.01); *H01Q 3/28* (2013.01); *H01Q 3/36* (2013.01); *H01Q 19/30* (2013.01); *H01Q 21/0025* (2013.01); *H01Q 21/062* (2013.01); *H01Q 21/065* (2013.01); *H03F 1/0211* (2013.01); *H03F 1/0261* (2013.01); *H03F 1/3282* (2013.01); *H03F 1/565* (2013.01); *H03F 3/19* (2013.01); *H03F 3/195* (2013.01); *H03F 3/245* (2013.01);
(Continued)

(58) Field of Classification Search
CPC ............. H01Q 21/0006; H01Q 1/2283; H01Q 21/065; H04B 1/48; H04B 1/18; H04B 1/44; H03F 3/19; H03F 3/245
USPC .......................................................... 455/83
See application file for complete search history.

(56) References Cited

U.S. PATENT DOCUMENTS

| | | | |
|---|---|---|---|
| 2004/0185795 A1* | 9/2004 | Shamsaifar | H01P 1/15 455/83 |
| 2005/0206477 A1* | 9/2005 | Cheema | H03H 9/02874 333/133 |
| 2017/0093043 A1* | 3/2017 | Chou | H05K 1/141 |

* cited by examiner

*Primary Examiner* — Ayodeji O Ayotunde
(74) *Attorney, Agent, or Firm* — Christopher P. Maiorana, PC

(57) ABSTRACT

An apparatus include a package, a chip and a plurality of bumps. The package may include (i) a plurality of bonding pads configured to exchange a plurality of radio-frequency signals with an antenna panel and (ii) a plurality of transmission lines configured to exchange the radio-frequency signals with the bonding pads. Two of the transmission lines may be connected to each of the bonding pads. The chip may be disposed in the package and may include (i) a plurality of transceiver channels configured to exchange the radio-frequency signals with the transmission lines and (ii) a plurality of switches configured to switch the radio-frequency signals to a signal ground. The bumps may be configured to exchange the radio-frequency signals between the transmission lines of the package and the transceiver channels of the chip. The transmission lines, the bumps and the switches may form a plurality of transmit/receive switches.

18 Claims, 6 Drawing Sheets

(51) Int. Cl.

| | |
|---|---|
| *H03F 1/56* | (2006.01) |
| *H03F 3/19* | (2006.01) |
| *H03G 3/30* | (2006.01) |
| *H03F 3/24* | (2006.01) |
| *H03K 21/10* | (2006.01) |
| *H04B 7/06* | (2006.01) |
| *H04B 1/04* | (2006.01) |
| *H04B 1/18* | (2006.01) |
| *H04B 1/48* | (2006.01) |
| *H01Q 1/52* | (2006.01) |
| *H01Q 3/28* | (2006.01) |
| *H01Q 3/36* | (2006.01) |
| *H01Q 19/30* | (2006.01) |
| *H01Q 21/06* | (2006.01) |
| *H03F 1/02* | (2006.01) |
| *H01Q 1/48* | (2006.01) |
| *H01Q 1/22* | (2006.01) |
| *H03H 7/48* | (2006.01) |
| *H04B 1/401* | (2015.01) |
| *H03F 1/32* | (2006.01) |
| *H03F 3/195* | (2006.01) |
| *H03F 3/45* | (2006.01) |
| *H03F 3/68* | (2006.01) |

(52) U.S. Cl.
CPC ..... *H03F 3/45089* (2013.01); *H03F 3/45475* (2013.01); *H03F 3/68* (2013.01); *H03G 3/3042* (2013.01); *H03H 7/487* (2013.01); *H03K 21/10* (2013.01); *H04B 1/0458* (2013.01); *H04B 1/18* (2013.01); *H04B 1/401* (2013.01); *H04B 1/44* (2013.01); *H04B 1/48* (2013.01); *H04B 7/0617* (2013.01); *H03F 2200/294* (2013.01); *H03F 2200/387* (2013.01); *H03F 2200/451* (2013.01)

DISTRIBUTED TRANSCEIVER SIGNAL SWITCHING CIRCUIT

This application relates to U.S. Provisional Application No. 62/559,875, filed Sep. 18, 2017, and U.S. Provisional Application No. 62/560,173, filed Sep. 18, 2017, each of which are hereby incorporated by reference in their entirety.

FIELD OF THE INVENTION

The invention relates to radio-frequency beam forming generally and, more particularly, to a method and/or apparatus for implementing a distributed transceiver signal switching circuit.

BACKGROUND

Phased array antenna panels are used to generate steerable beams that may be utilized in wireless communication systems. Phased arrays create a focused beam that can be steered very quickly to maintain a link for any on-the-move communication system. For bidirectional communication, switches are conventionally implemented in integrated circuits to separate transmission signals from received signals. However, conventional switch circuitry suffer from high insertion losses and low power handing due to low Q of on-chip inductors and transmission lines.

It would be desirable to implement a distributed transceiver signal switching circuit.

SUMMARY

The invention concerns an apparatus including a package, a chip and a plurality of bumps. The package may include (i) a plurality of bonding pads configured to exchange a plurality of radio-frequency signals with an antenna panel and (ii) a plurality of transmission lines configured to exchange the radio-frequency signals with the bonding pads. Two of the transmission lines may be connected to each of the bonding pads. The chip may be disposed in the package and may include (i) a plurality of transceiver channels configured to exchange the radio-frequency signals with the transmission lines and (ii) a plurality of switches configured to switch the radio-frequency signals to a signal ground. The bumps may be configured to exchange the radio-frequency signals between the transmission lines of the package and the transceiver channels of the chip. The transmission lines, the bumps and the switches may form a plurality of transmit/receive switches.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a distributed transceiver signal switching circuit that may (i) be applied inside packaged beam formers (ii) be partially implemented on-chip and partially implemented off-chip, (iii) utilize solder bump connections, (iv) utilize package transmission lines and/or (v) be implemented as one or more packaged devices.

Figure 1:
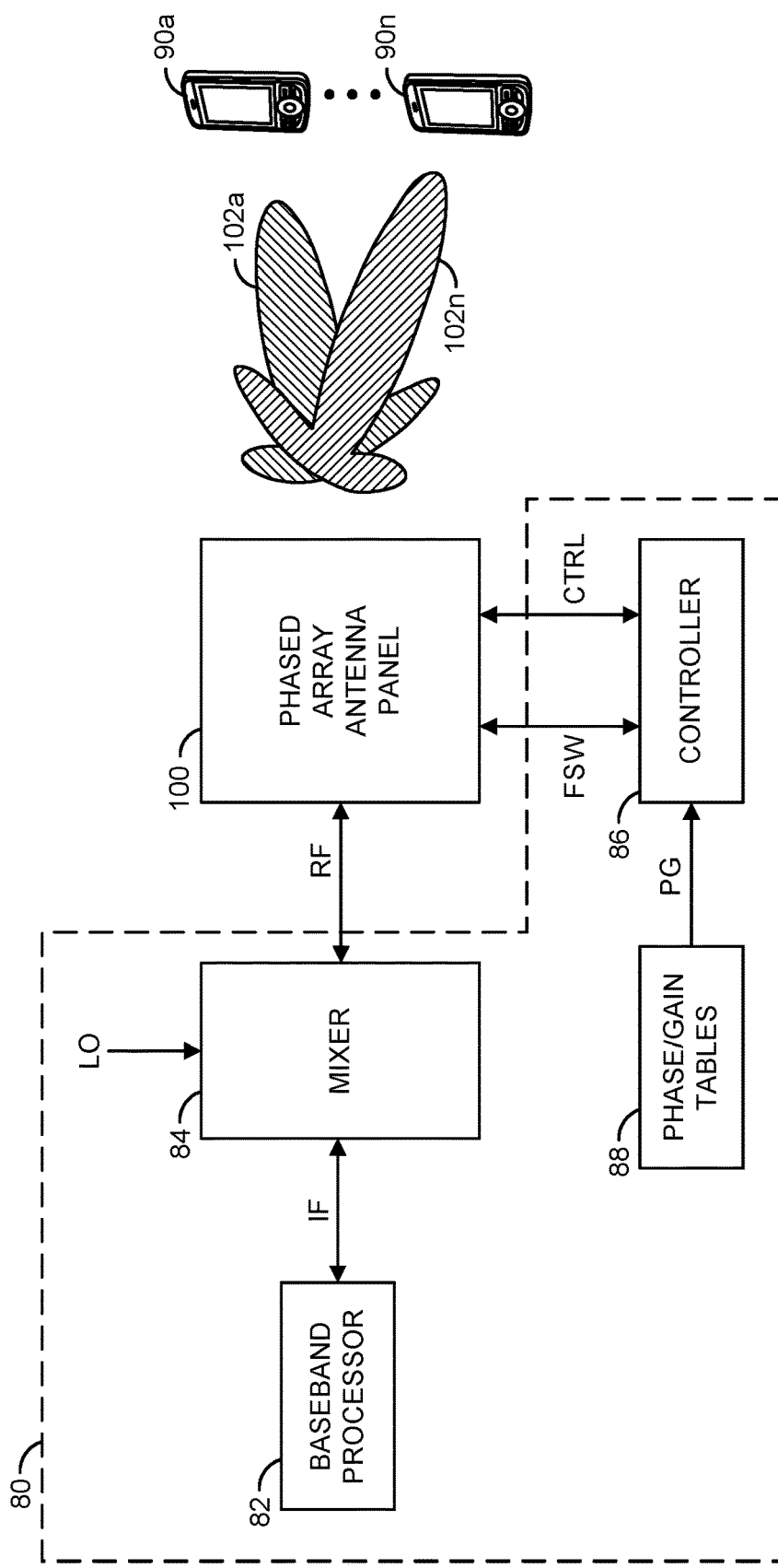
FIG. 1 is a diagram of a system illustrating a context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as a common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software.

A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications ($I^2C$), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4-GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
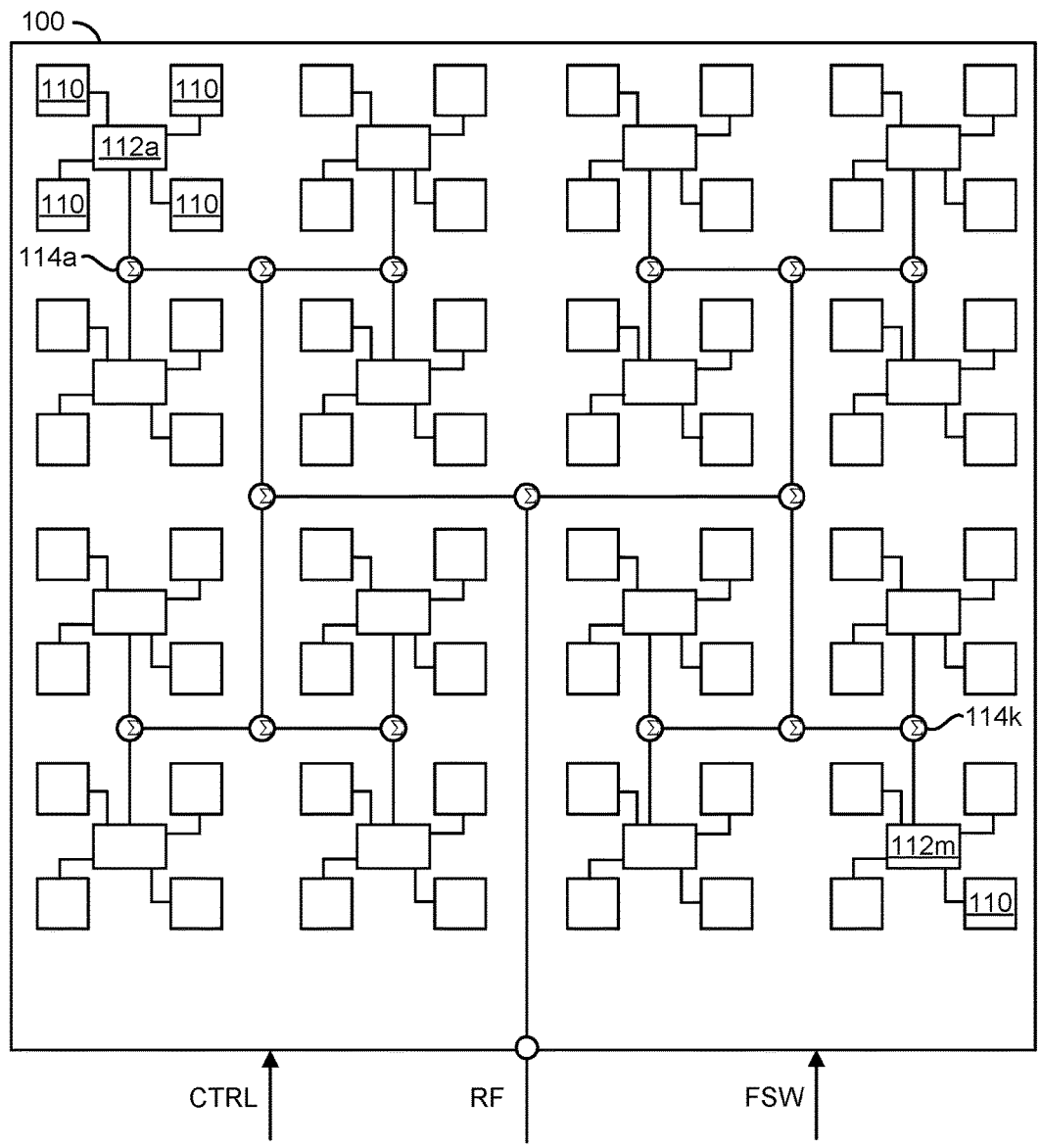
FIG. 2 is a diagram illustrating a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit (or device). Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 100 and each of the circuits 112a-112m.

Figure 3:
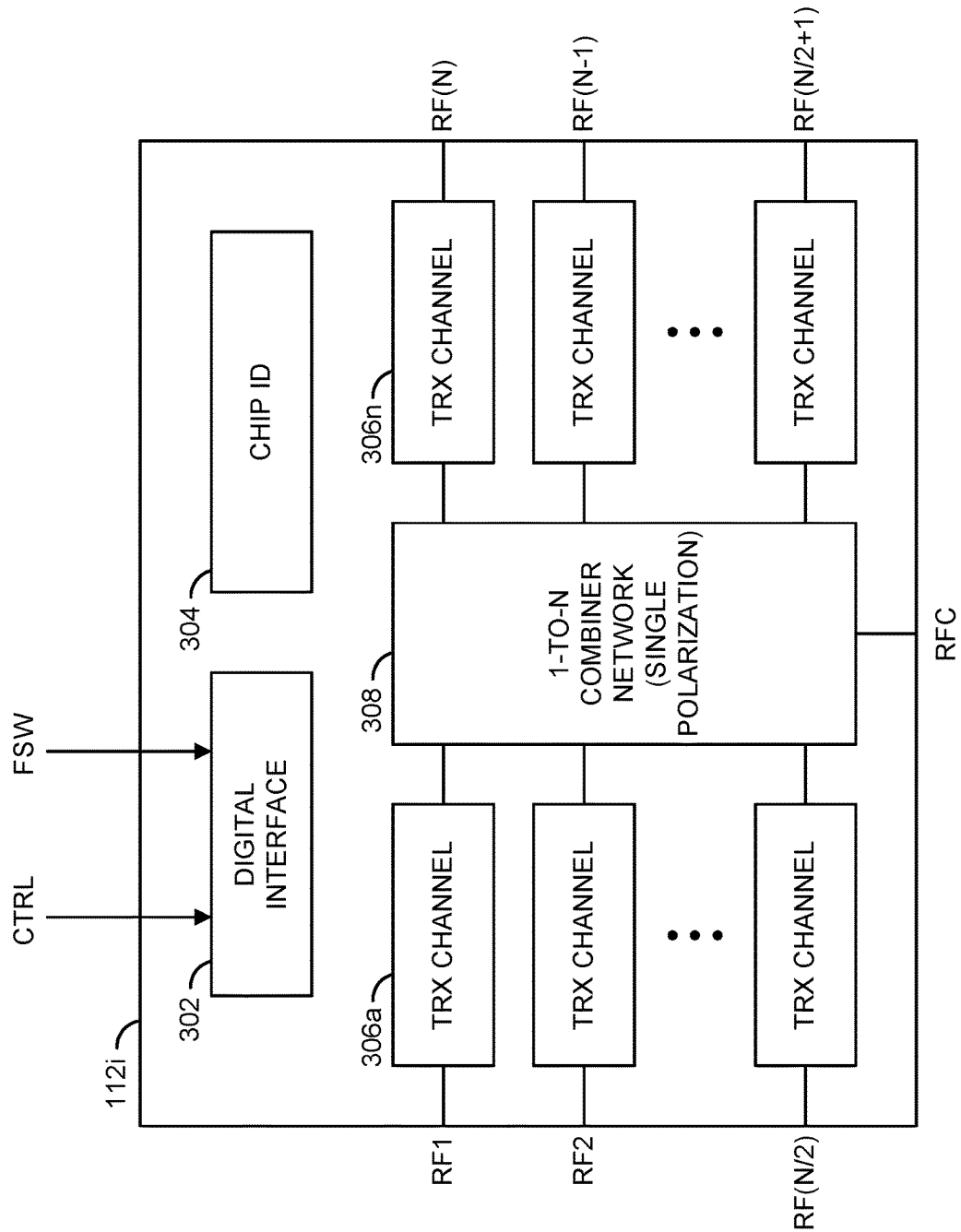
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I²C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW. In an example, the circuit 302 may implement a 4-wire embedded SPI core. In an example, the circuit 304 may set a physical address of the beam former circuit 112i based upon hardware coded address bits (or pins). In some embodiments, the hard-wired address bits may be hard coded within the chip implementing the beam former 112i. In some embodiments, the hard-wired address bits may be programmable within the chip implementing the beam former 112i during manufacturing. In an example, the hard-wired address bits may be programmed using fuses, anti-fuses, or other conventional techniques.

Figure 4:
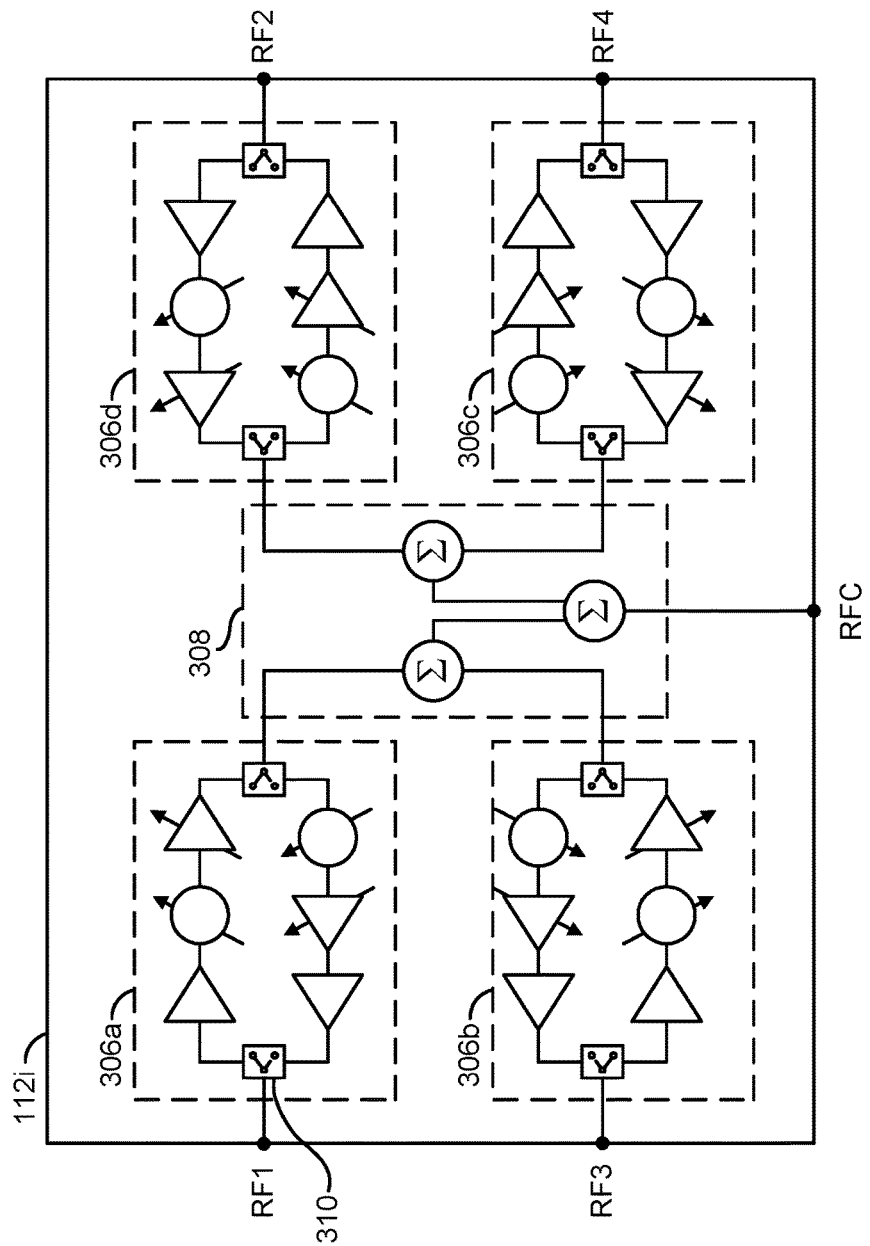
FIG. 4 is a diagram illustrating a four transceiver channel single-polarization beam former circuit in accordance with an example embodiment of the invention.

Referring to FIG. 4, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112i may implement four transceiver channels 306a-306d. Each of the four transceiver channels (or circuits) 306a-306d may include a transmit/receive (T/R) switch 310 that may couple to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

Each switch 310 may be implemented as a distributed transceiver switching circuit (or device). A portion of each switch 310 may be implemented in (on) the integrated circuits (or chips) used to form the circuits 306a-306d. Another portion of each switch 310 may be implemented in transmission lines in (on) packages that house the integrated circuits. Still another portion of each switch 310 may be implemented in solder bumps used to connect the integrated circuits to the transmission lines in the packages.

Figure 5:
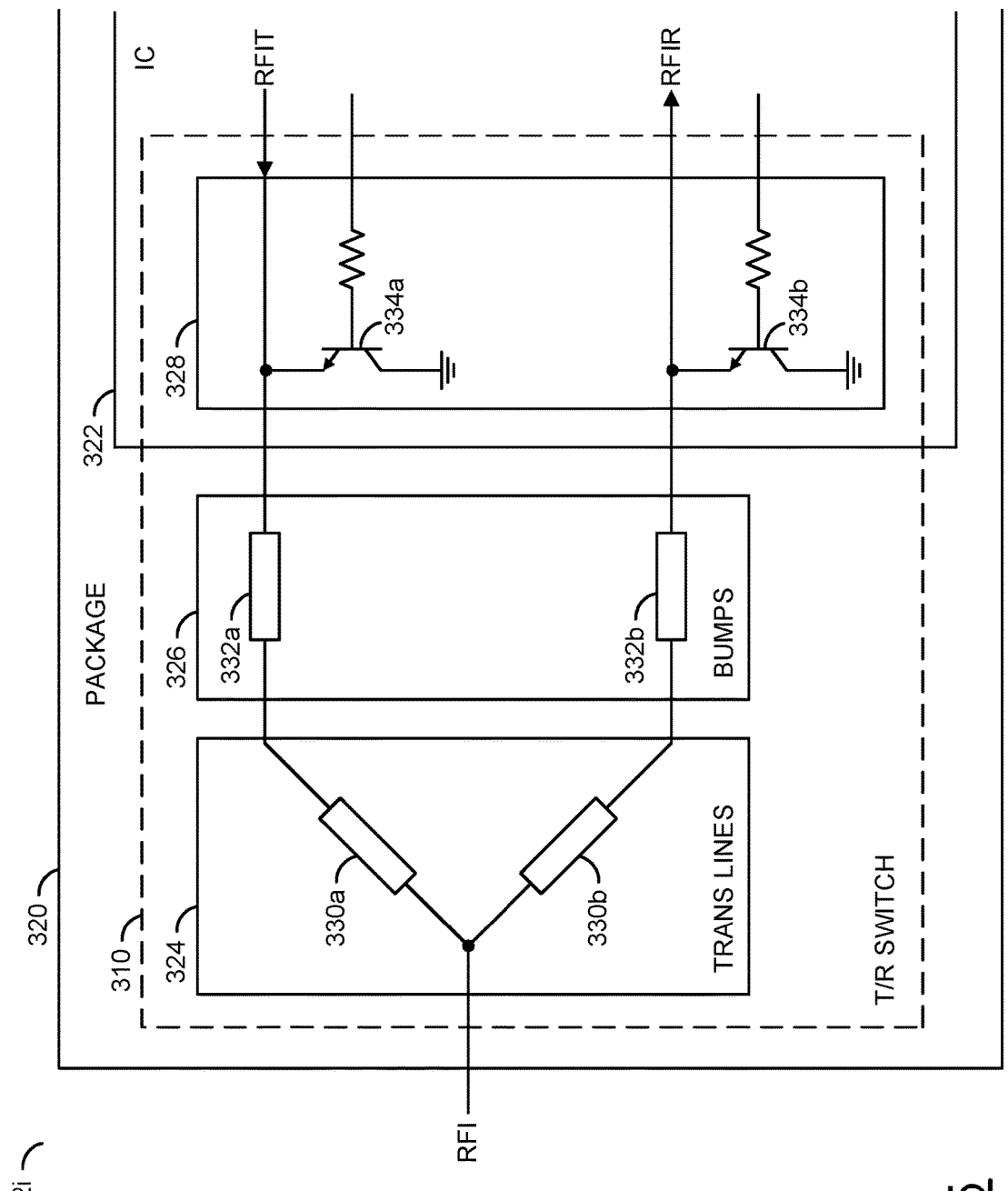
FIG. 5 is a diagram illustrating a switch in accordance with an example embodiment of the invention.

Referring to FIG. 5, a diagram illustrating an example implementation of a switch 310 is show in accordance with an example embodiment of the invention. The switch 310 may be implemented in a distributed fashion between a package 320 of the beam former circuit 112i at one end and an integrated circuit (IC) 322 of the beam former circuit 112i at the other end. The switch 310 generally comprises a block (or circuit) 324, a block (or circuit) 326 and a block (or circuit) 328. The circuit 324 may be implemented as part of the package 320. The circuit 328 may be implemented as part of the integrated circuit 322. The circuit 326 may be implemented as an interface between the integrated circuit 322 and the package 320.

The circuit 324 generally comprises multiple transmission lines 330a-330b. The circuit 326 generally comprises multiple solder bumps 332a-332b. The circuit 328 generally comprises multiple switches 334a-334b. Each switch 334a-334b may have a node connected to a signal path and another node connected to a signal ground.

Each switch 334a-334b may be a single switch or a stacked switch. In various embodiments, the switches 334a-334b may be implemented as one or more transistors and/or one or more diodes. Each switch 334a-334b may include, but is not limited to a bipolar junction transistor (BJT), a heterojunction bipolar transistor (HBT), a metal-oxide-silicon field-effect transistor (MOSFET), a pseudomorphic high-electron-mobility transistor (pHEMT), a silicon-on-insulator (SOI) switch and/or a diode-based switch. Although each switch 334a-334b is illustrated as a single bipolar junction transistor, other types and numbers of switches may be implemented to meet the design criteria of a particular application.

A signal (e.g., RF1T) may be received by the circuit 328. The signal RF1T may implement a transmit signal generated by a transmit channel of a transceiver circuit (e.g., the circuit 306a). A signal (e.g., RF1R) may be presented by the circuit 328. The signal RF1R may implement a receive signal received into a receive channel of the transceiver circuit. The signal RF1 may be exchanged with the circuit 324. In the embodiment illustrated, the integrated circuit 322 may have multiple (e.g., two) interfaces to the package 320 for each transceiver channel 306a-306d, one interface for the transmit signals (e.g., RF1T) along one signal path and another interface for the receive signals (e.g., RF1R) along another signal path.

The transmission lines 330a-330b, the bumps 332a-332b and the signal paths between the bumps 332a-332b and the switches 334a-334b in the circuit 328 are generally configured as a Wilkinson combiner/splitter circuit. In various embodiments, a distance from the point where the transmission lines 330a-330b join in the circuit 324 to each switch 334a-334b in the circuit 328 may be approximately a quarter wavelength of the signal RF1. A total distance between the switches 334a and 334b in the circuit 328 through the circuits 326 and 324 may be approximately half a wavelength of the signal RF1.

In the transmission mode, the switch 334a may be in an open (or non-conducting) condition and the switch 334b may be in a closed (or conducting) condition. The signal RF1T may be transferred through the circuit 328, through the bump 322a in the circuit 326, through the transmission line 330a in the circuit 324, and presented as the signal RF1 to the respective antenna element 110. The transmission line 330b, the bump 332b, the signal path to the switch 334b, and the path through the switch 334b to the signal ground may form a tuned stub. Any energy from the signal RF1T directed down the transmission line 330b may be reflected back by the stub toward the antenna element 110 at the receive transistor instead of continuing on as the signal RF1R.

In the receive mode, the switch 334a may be in the closed condition and the switch 334b may be in the open condition. The signal RF1 may be transferred through the transmission line 330b in the circuit 324, through the bump 332b in the circuit 326, past the open switch 334b in the circuit 328, and presented as the signal RF1R to the receive channel of the transceiver channel circuit 306a. The transmission line 330a, the bump 332a, the signal path to the switch 334a, and the path through the switch 334a to the signal ground may form another tuned stub. Any energy from the signal RF1 directed down the transmission line 330a may be reflected back by the stub instead of continuing on to the transmit channel of the transceiver circuit 306a.

Figure 6:
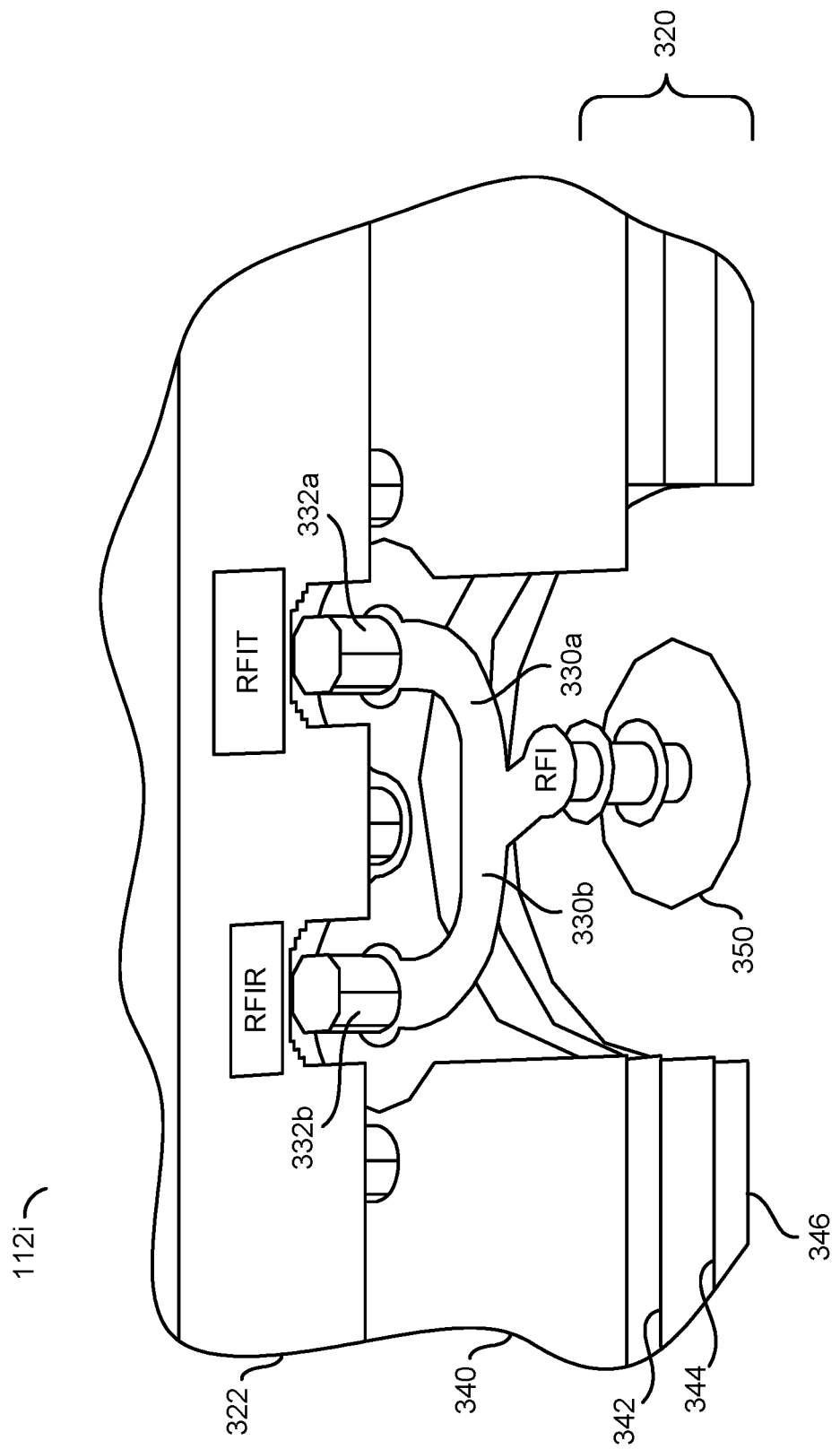
FIG. 6 is a diagram illustrating a portion of the switch of FIG. 5 in accordance with an embodiment of the invention.

Referring to FIG. 6, a diagram illustrating an example implementation of a portion of the switch 310 is shown in accordance with an embodiment of the invention. The package 320 of the beam former circuit 112i generally comprises multiple conductive (e.g., metal) layers 340-346. The conductive layer 340 may be disposed on a side of the package 320 facing the integrated circuit 322. The conductive layer 346 may be disposed on an opposite side of the package 320 (e.g., a side of the package 320 facing a printed circuit board of the phased array antenna panel 100). The conductive layers 342 and 344 may implement intermediate layers in the package 320. Other numbers of intermediate conductive layers may be implemented to meet the design criteria of a particular application.

The transmission lines 330a-330b may be formed in the conductive layer 340. The transmission lines 330a-330b may be connected to the signals RF1R and RF1T through the bumps 332a-332b. A ball bonding pad 350 may be formed in the conductive layer 348. The bonding pad 350 may form a common port of the circuit 112i for the signal RF1. Inter-layer conductive vias may couple the pad 350 with the point in the conductive layer 340 where the transmission lines 330a-330b join (or meet) each other. The bonding pad 350 may connect the circuit 112i through a package (or solder) ball to the phased array antenna panel 100. The bonding pad 350 and package ball may carry the signal RF1 in both directions between the circuit 112i and the phased array antenna panel 100.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:
1. An apparatus comprising:
  a package comprising (i) a plurality of bonding pads configured to exchange a plurality of radio-frequency signals with an antenna panel and (ii) a plurality of transmission lines configured to exchange said radio-frequency signals with said bonding pads, wherein two of said transmission lines are connected to each of said bonding pads;
  a chip disposed in said package and comprising (i) a plurality of transceiver channels configured to exchange said radio-frequency signals with said transmission lines and (ii) a plurality of switches configured to switch said radio-frequency signals to a signal ground; and
  a plurality of bumps configured to exchange said radio-frequency signals between said transmission lines of said package and said transceiver channels of said chip, wherein said transmission lines, said bumps and said switches form a plurality of transmit/receive switches.
2. The apparatus according to claim 1, wherein each of said transmit/receive switches comprises two of said transmission lines in said package, two of said bumps and two of said switches in said chip.
3. The apparatus according to claim 2, wherein each one of said transmission lines, a corresponding one of said bumps and a corresponding one of said switches form a tuned stub while said corresponding switch is conducting.
4. The apparatus according to claim 2, wherein said two transmission lines and said two bumps for a Wilkinson circuit.

5. The apparatus according to claim 1, wherein one said switches is connected to a signal path between each of said bumps and a corresponding one of said transceiver channels.

6. The apparatus according to claim 1, wherein each of said radio-frequency signals has a frequency of at least one of (i) a radio frequency, (ii) a millimeter-wave frequency, (iii) a microwave frequency or (iv) any combination thereof.

7. The apparatus according to claim 1, wherein each of said radio-frequency signals has a frequency in a range of 24 gigahertz to 44 gigahertz.

8. The apparatus according to claim 1, wherein said package and said chip form part of a two-dimensional antenna network.

9. The apparatus according to claim 1, wherein said package and said chip form part of a fifth-generation wireless communications system.

10. A method for distributed transceiver signal switching, comprising the steps of:
  exchanging a plurality of radio-frequency signals between a plurality of bonding pads of a package and an antenna panel;
  exchanging said radio-frequency signals between said bonding pads of said package and a plurality of transmission lines of said package, wherein two of said transmission lines are coupled to each of said bonding pads;
  exchanging said radio-frequency signals between said transmission lines and a plurality of bumps;
  exchanging said radio-frequency signals between said bumps and a plurality of transceiver channels of a chip, wherein said chip is disposed in said package; and
  switching said radio-frequency signals to a signal ground with a plurality of switches in said chip, wherein said transmission lines, said bumps and said switches form a plurality of transmit/receive switches.

11. The method according to claim 10, wherein each of said transmit/receive switches comprises two of said transmission lines in said package, two of said bumps and two of said switches in said chip.

12. The method according to claim 11, wherein each one of said transmission lines, a corresponding one of said bumps and a corresponding one of said switches form a tuned stub while said corresponding switch is conducting.

13. The method according to claim 11, wherein said two transmission lines and said two bumps for a Wilkinson circuit.

14. The method according to claim 10, wherein one said switches is connected to a signal path between each of said bumps and a corresponding one of said transceiver channels.

15. The method according to claim 10, wherein each of said radio-frequency signals has a frequency of at least one of (i) a radio frequency, (ii) a millimeter-wave frequency, (iii) a microwave frequency or (iv) any combination thereof.

16. The method according to claim 10, wherein each of said radio-frequency signals has a frequency in a range of 24 gigahertz to 44 gigahertz.

17. The method according to claim 10, wherein said package and said chip form part of (i) a two-dimensional antenna network, (ii) a fifth-generation wireless communications system or (iii) any combination thereof.

18. An apparatus comprising:
  an antenna panel comprising a plurality of antenna elements;
  a plurality packages each mounted on said antenna panel at a center of four of said antenna elements, each of said packages comprising (i) a plurality of bonding pads configured to exchange a plurality of radio-frequency signals with said antenna panel and (ii) a plurality of transmission lines configured to exchange said radio-frequency signals with said bonding pads, wherein two of said transmission lines are connected to each of said bonding pads,
  a plurality of chips disposed in said packages, each of said chips comprising (i) a plurality of transceiver channels configured to exchange said radio-frequency signals with said transmission lines and (ii) a plurality of switches configured to switch said radio-frequency signals to a signal ground; and
  a plurality of bumps configured to exchange said radio-frequency signals between said transmission lines of said packages and said transceiver channels of said chips, wherein said transmission lines, said bumps and said switches form a plurality of transmit/receive switches.

* * * * *